(12) United States Patent
Matsukawa

(10) Patent No.: US 6,706,636 B2
(45) Date of Patent: Mar. 16, 2004

(54) METHOD OF REGENERATING SEMICONDUCTOR WAFER

(75) Inventor: Kazuhito Matsukawa, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/175,784

(22) Filed: Jun. 21, 2002

(65) Prior Publication Data

US 2003/0153164 A1 Aug. 14, 2003

(30) Foreign Application Priority Data

Feb. 13, 2002 (JP) .................................. P2002-035083

(51) Int. Cl.7 ...................... H01L 21/302; H01L 21/461
(52) U.S. Cl. ........................................ 438/692; 438/906
(58) Field of Search ................................. 438/690, 691, 438/692, 680, 475, 663, 759, 760, 779, 905, 906

(56) References Cited

U.S. PATENT DOCUMENTS

| | | | | |
|---|---|---|---|---|
| 3,923,567 A | * | 12/1975 | Lawrence | 156/7 |
| 5,855,735 A | * | 1/1999 | Takada et al. | 156/636.1 |
| 6,458,712 B2 | * | 10/2002 | Kramer et al. | 438/749 |

FOREIGN PATENT DOCUMENTS

| | | | |
|---|---|---|---|
| EP | 0 986 097 A2 | 3/2000 | |
| JP | 11-168106 | 6/1999 | |
| JP | 0986097 A2 * | 8/1999 | ......... H01L/21/306 |
| JP | 2000-138192 | 5/2000 | |
| TW | 436934 | 5/2001 | |
| TW | 448245 | 8/2001 | |

* cited by examiner

Primary Examiner—David Nhu
(74) Attorney, Agent, or Firm—Oblon, Spivak, McClelland, Maier & Neustadt, P.C.

(57) ABSTRACT

A method of regenerating a semiconductor wafer which allows a used wafer, even if the wafer contains a crystal defect such as a COP, to be regenerated into a high-quality semiconductor wafer is provided. A used silicon wafer is polished in a step S1. Next, the used silicon wafer is immersed in mixed acids including at least two kinds of acids in a step S2. A surface treatment is performed on the used silicon wafer to planarize the surface of the used silicon wafer in a step S3. Then, a high temperature annealing process is performed in a step S4, to ultimately obtain a regenerate wafer. The high temperature annealing process includes either a first high temperature annealing process which is performed at a high temperature of 1200° C. or higher in an argon atmosphere for 30 to 60 minutes, or a second high temperature annealing process which is performed at a high temperature of 1200° C. or higher in a hydrogen atmosphere for 30 to 60 minutes.

14 Claims, 6 Drawing Sheets

METHOD OF REGENERATING SEMICONDUCTOR WAFER

BACKGROUND OF THE INVENTION

1. Field of the Invention

The present invention relates to a method of regenerating a semiconductor wafer which is used during manufacture of a semiconductor device.

2. Description of the Background Art

Conventionally, regeneration of a semiconductor wafer has been practiced by performing processes of polishing, surface treatment and the like on a used wafer, to reuse the used wafer as a regenerate wafer.

However, a dummy wafer or a monitor wafer (i.e., a wafer used for various tests which does not have an actual integrated circuit formed therein) has been manufactured with a crystal defect therein such as a COP (crystal originated particle) being uncontrolled. Accordingly, in accordance with the conventional practices, regeneration of the dummy wafer would expose a crystal defect such as a COP formed in a substrate of the dummy wafer in a surface of the dummy wafer, or newly produce a crystal defect such as a COP in a surface of the dummy wafer, due to a polishing process or the like required for the regeneration. As such, there has been a problem that a regenerate wafer obtained by regenerating a dummy wafer or the like is of no practical use.

FIG. 9 is a view schematically illustrating an example of a COP. FIG. 9 shows that a regenerate wafer 11 to which a conventional method of regenerating a semiconductor wafer has been applied has a COP 12 exposed in a surface thereof.

FIG. 10 is a view schematically illustrating another example of a COP. FIG. 10 shows that a regenerate wafer 21 to which the conventional method of regenerating a semiconductor wafer has been applied has a COP 22 produced in a surface thereof.

SUMMARY OF THE INVENTION

It is an object of the present invention to obtain a method of regenerating a semiconductor wafer which allows a used wafer, even if the wafer contains a crystal defect such as a COP, to be regenerated into a high-quality semiconductor wafer.

A first aspect of the present invention is intended for a method of regenerating a used semiconductor wafer in which a surface coating layer including a metal film and an insulating film is formed at least in a surface thereof. According to the present invention, the method includes the following steps (a) to (d). The step (a) is to polish the surface of the used semiconductor wafer. The step (b) is to immerse the used semiconductor wafer after the step (a) in mixed acids including at least two kinds of acids. The step (c) is to perform a surface treatment on the used semiconductor wafer after the step (b). The step (d) is to perform an annealing process on a quasi-regenerate wafer which is the used semiconductor wafer after the step (c).

The annealing process on the quasi-regenerate wafer in the step (d). This makes it possible to significantly reduce crystal defects remaining in the quasi-regenerate wafer. Accordingly, a high-quality regenerate wafer can be obtained after the step (d).

A second aspect of the present invention is intended for a method of regenerating a used semiconductor wafer in which a surface coating layer including a metal film and an insulating film is formed at least in a surface thereof. According to the present invention, the method includes the following steps (a) to (d). The step (a) is to polish the surface of the used semiconductor wafer. The step (b) is to immerse the used semiconductor wafer after the step (a) in mixed acids including at least two kinds of acids. The step (c) is to perform a surface treatment on the used semiconductor wafer after the step (b). The step (d) is to cause a quasi-regenerate wafer which is the used semiconductor wafer after the step (c) to epitaxially grow to form an epitaxial growth layer, thereby obtaining a regenerate wafer including the quasi-regenerate wafer and the epitaxial growth layer.

The epitaxial growth process in which the quasi-regenerate wafer is caused to epitaxially grow to form the epitaxial growth layer in the step (d). This makes it possible to significantly reduce crystal defects remaining in the quasi-regenerate wafer. Accordingly, a high-quality regenerate wafer can be obtained after the step (d).

These and other objects, features, aspects and advantages of the present invention will become more apparent from the following detailed description of the present invention when taken in conjunction with the accompanying drawings.

DESCRIPTION OF THE PREFERRED EMBODIMENTS

Preferred Embodiments

<First Preferred Embodiment>

Figure 1:
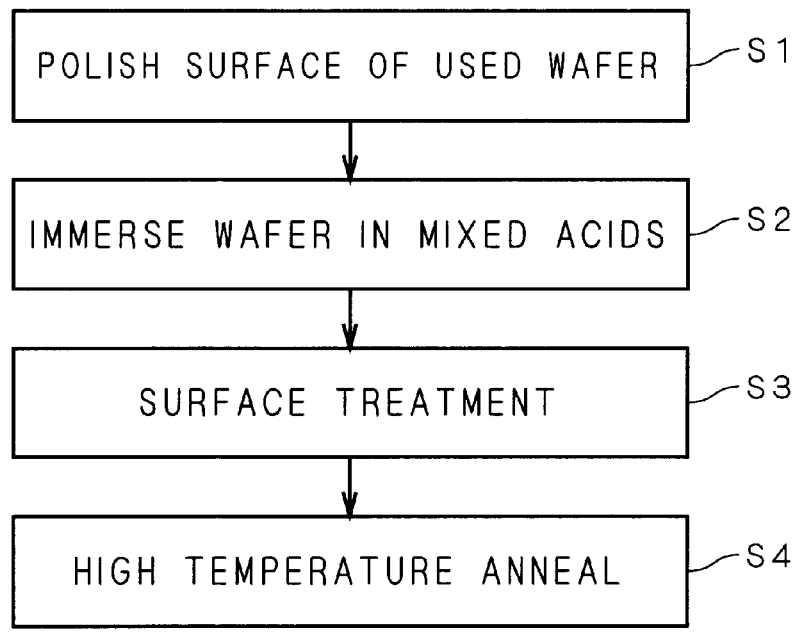
FIG. 1 is a flow chart showing a procedure of a method of regenerating a semiconductor wafer according to a first preferred embodiment of the present invention.

FIG. 1 is a flow chart showing a procedure of a method of regenerating a semiconductor wafer according to a first preferred embodiment of the present invention.

First, a surface of a used silicon wafer is polished in a step S1. It is noted that the "used silicon wafer" referred to in the instant description includes: a silicon wafer which has been actually used and has an integrated circuit formed in a surface thereof; and a silicon wafer used for a test such as a dummy wafer, a monitor wafer or the like which has a surface in which a surface coating layer including a metal film formed of at least one kind of metallic material not containing silicon and further including an insulating film of an oxide film or the like is formed.

Next, the used silicon wafer is immersed in mixed acids including at least two kinds of acids in a step S2. As a result, a layer forming the surface of the wafer which includes either the integrated circuit or the surface coating layer as noted above is removed, so that silicon is exposed in the surface of the wafer.

For the mixed acids, a nitric acid, a hydrochloric acid, a hydrofluoric acid, a sulfuric acid and an acetic acid can be employed. The temperature of the mixed acids is set at 80 to 100° C., for purposes of facilitating removal of a foreign substance such as a particle adhered to the used silicon wafer.

Then, a surface treatment (polishing) is performed on the used silicon wafer to planarize the surface of the used silicon wafer in a step S3. Subsequently to this, a high temperature annealing process is performed in a step S4, thereby to ultimately obtain a regenerate wafer.

Figure 2:
FIG. 2 is a view schematically illustrating a high temperature annealing process in the first preferred embodiment of the present invention.

FIG. 2 is a view schematically illustrating the high temperature annealing process performed in the step S4. As shown therein, the high temperature annealing process performed in the step S4 includes either a first annealing process which is performed at a high temperature of 1200° C. or higher in an argon atmosphere for 30 to 60 minutes, or a second annealing process which is performed at a high temperature of 1200° C. or higher in a hydrogen atmosphere for 30 to 60 minutes. By performing the first or second annealing process, a regenerate wafer 1 can be ultimately obtained. The setting of the temperature for each of the first and second annealing processes at the high temperature of 1200° C. or higher is intended to effectively reduce COPs.

Figure 3:
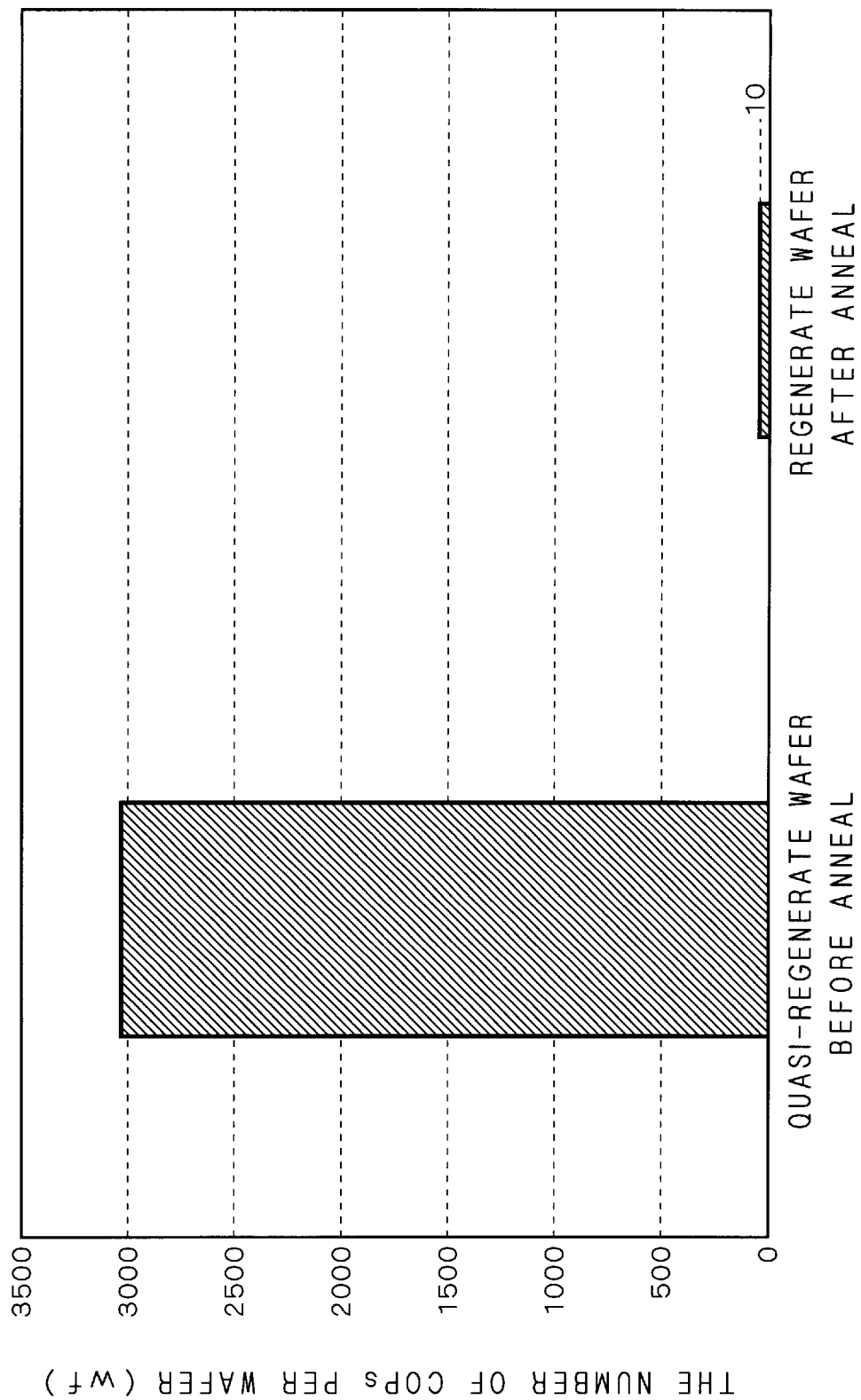
FIG. 3 is a graph showing experimental results of regeneration of a semiconductor wafer achieved using the method of regenerating a semiconductor wafer according to the first preferred embodiment of the present invention.

FIG. 3 is a graph showing experimental results of regeneration of a semiconductor wafer achieved using the method of regenerating a semiconductor wafer according to the first preferred embodiment. As shown therein, the number of COPs produced per quasi-regenerate wafer on which the processes of the steps S1 to S3 have been performed is no less than approximately 3000. However, after the high temperature annealing process of the step S4 is further performed so that the quasi-regenerate wafer is turned into the regenerate wafer 1, the number of COPs is drastically reduced to about 10 per wafer.

It is additionally noted that the "COP" referred to in the instant description means a surface defect having a dimension of 0.13 μm or smaller. Various experimental results have ascertained the fact that the method of regenerating a semiconductor wafer according to the first preferred embodiment makes it possible to control the number of crystal defects including COPs to 30 per wafer, thereby to obtain a high-quality regenerate wafer.

Figure 4:
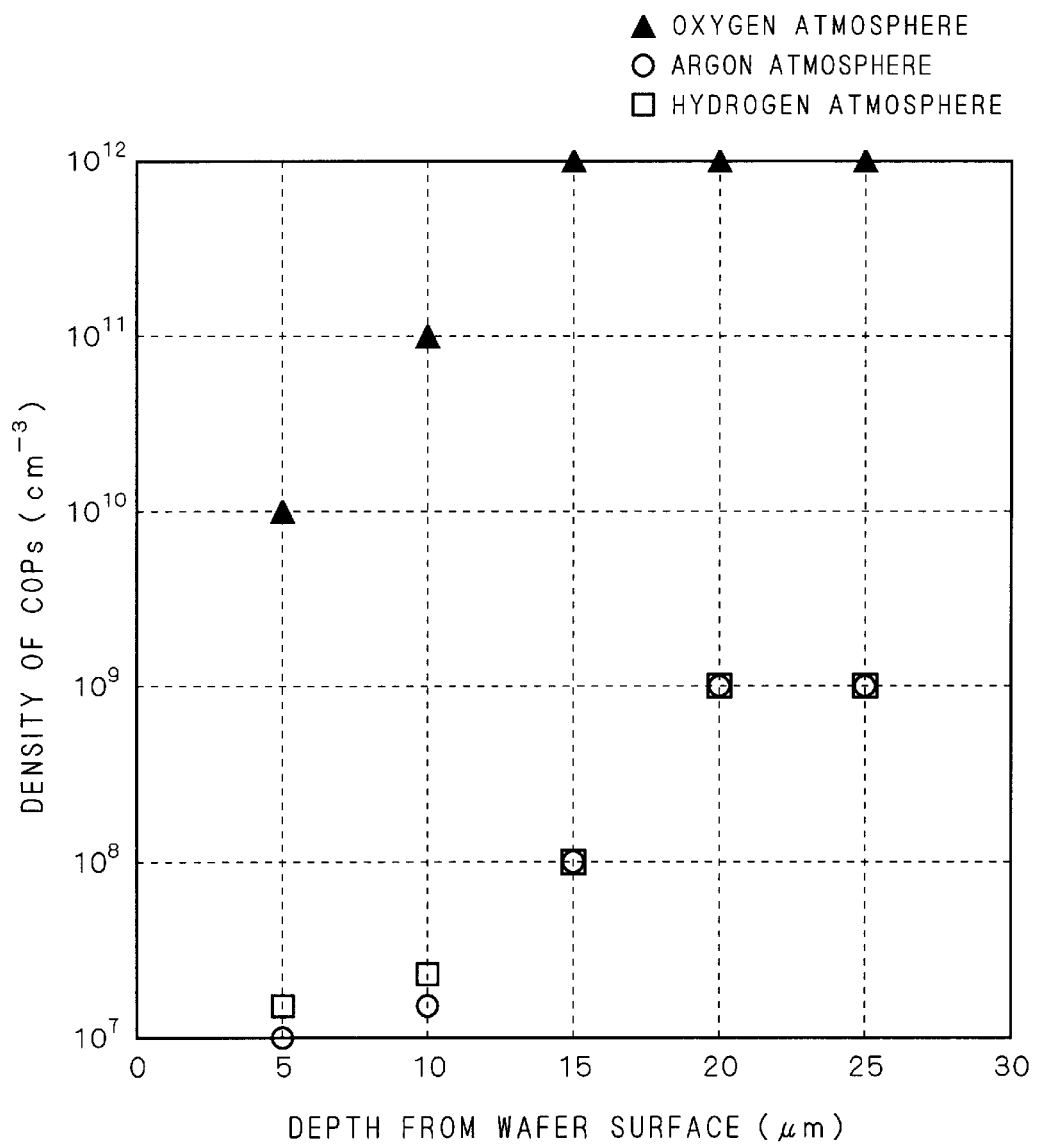
FIG. 4 is a graph indicating comparison of annealing processes with different details.

FIG. 4 is a graph indicating comparison of annealing processes with different details. As shown therein, an annealing process employing a hydrogen or argon atmosphere more significantly reduces the density of defects, i.e., the density of COPs in the wafer than an annealing process employing an oxygen atmosphere, particularly in a portion of the wafer located deeper from the surface of the wafer. As is made clear from this, to perform the high temperature annealing process of the step S4 employing a hydrogen or argon atmosphere is more effective in reducing the number of COPs than an annealing process employing a different atmosphere such as an oxygen atmosphere.

<Second Preferred Embodiment>

Figure 5:
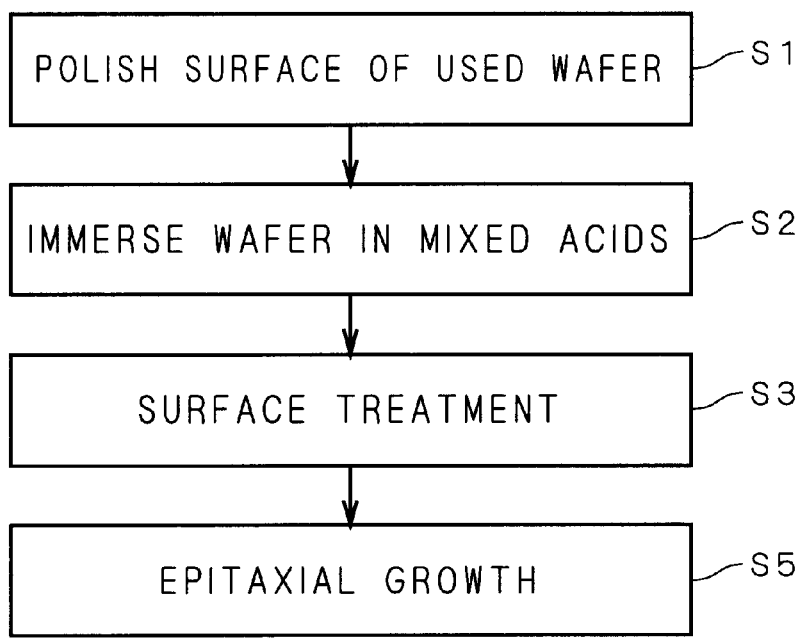
FIG. 5 is a flow chart showing a procedure of a method of regenerating a semiconductor wafer according to a second preferred embodiment of the present invention.

FIG. 5 is a flow chart showing a procedure of a method of regenerating a semiconductor wafer according to a second preferred embodiment of the present invention. As shown therein, the steps S1 to S3 are performed in the same manner as in the first preferred embodiment.

After the step S3, an epitaxial growth process is performed in a step S5.

Figure 6:
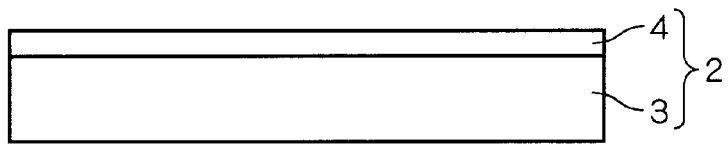
FIG. 6 is a view schematically illustrating an epitaxial growth process in the second preferred embodiment of the present invention.

FIG. 6 is a view schematically illustrating the epitaxial growth process performed in the step S5. As illustrated therein, a quasi-regenerate wafer 3 which has undergone the steps S1 to S3 is caused to epitaxially grow approximately 1 to 10 μm, to form an epitaxial growth layer 4. Then, a regenerate wafer 2 formed of the quasi-regenerate wafer 3 and the epitaxial growth layer 4 is ultimately obtained.

Figure 7:
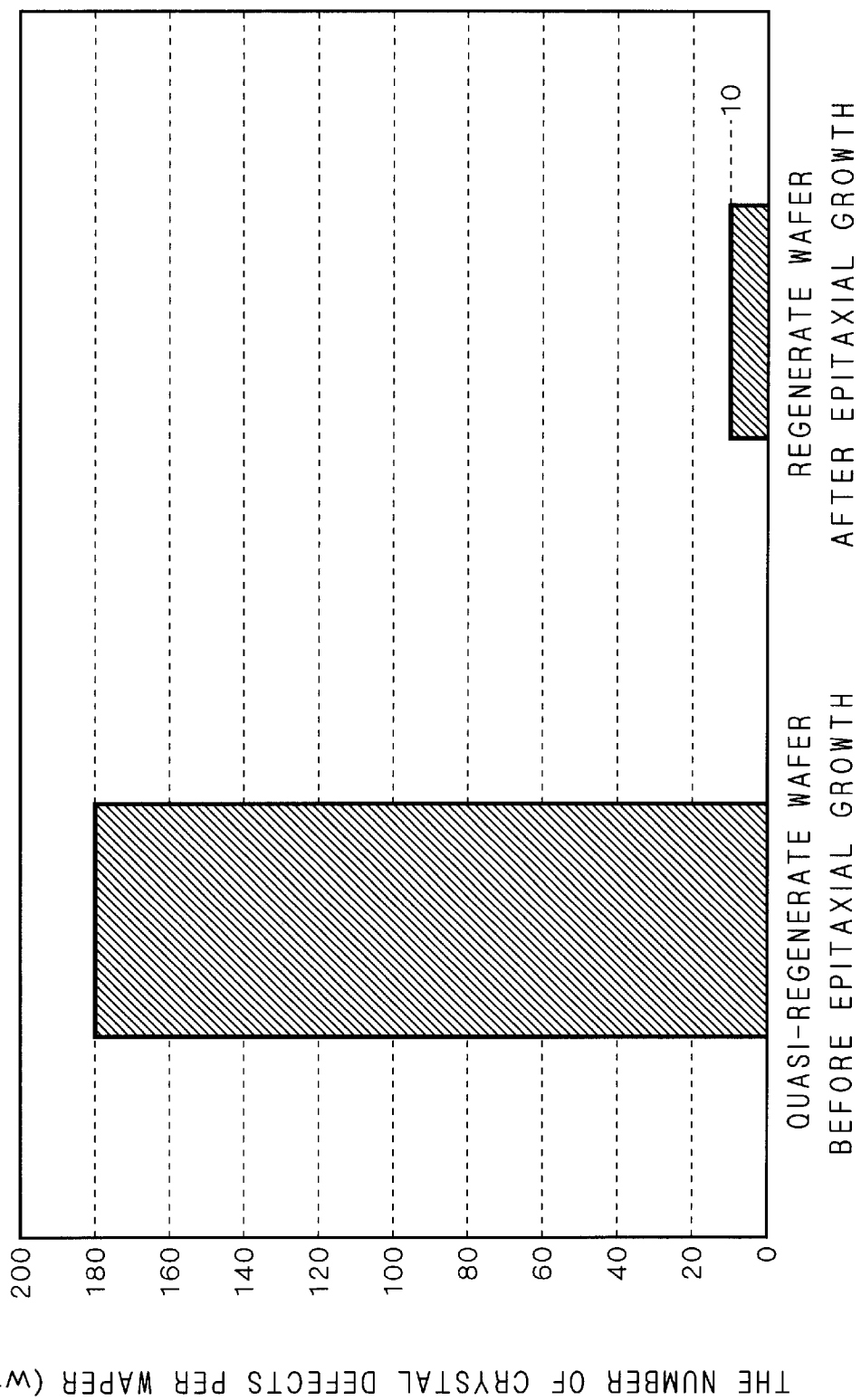
FIG. 7 is a graph indicating experimental results of regeneration of a semiconductor wafer achieved using the method of regenerating a semiconductor wafer according to the second preferred embodiment of the present invention.

FIG. 7 is a graph showing experimental results of regeneration of a semiconductor wafer achieved using the method of regenerating a semiconductor wafer according to the second preferred embodiment. As shown therein, the number of crystal defects including COPs and scratches (minute cuts) produced per quasi-regenerate wafer on which the processes of the steps S1 to S3 have been performed is no less than approximately 180. However, after the epitaxial growth process of the step S5 is further performed so that the quasi-regenerate wafer 3 is turned into the regenerate wafer 2, the number of crystal defects is drastically reduced to about 10 per wafer.

Various experimental results have ascertained the fact that the method of regenerating a semiconductor wafer according to the second preferred embodiment makes it possible to control the number of crystal defects including COPs to 10 per wafer, thereby to obtain a high-quality regenerate wafer.

It is additionally noted that while the number of crystal defects produced before the epitaxial growth process which is shown in FIG. 7 is smaller than the number of COPs produced before the annealing process which is shown in FIG. 3, such difference is caused due to difference in the used silicon wafer as an object for the experiments.

<Third Preferred Embodiment>

Figure 8:
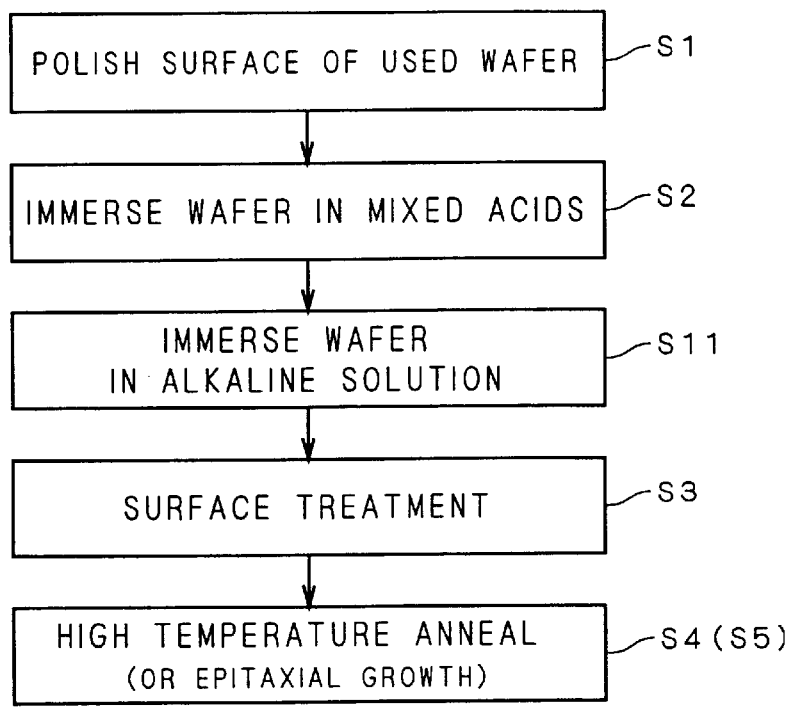
FIG. 8 is a flow chart showing a procedure of a method of regenerating a semiconductor wafer according to a third preferred embodiment of the present invention.
Figure 9:
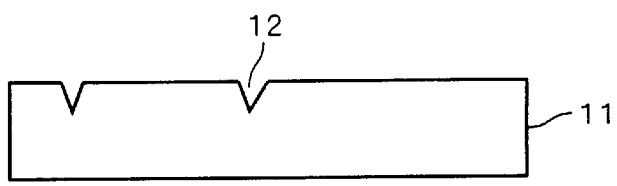
FIGS. 9 and 10 are views schematically illustrating examples of COPs.
Figure 10:
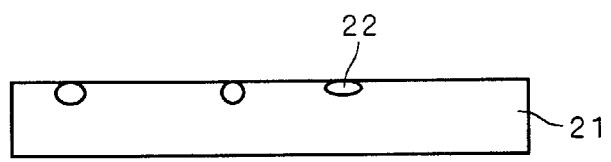

FIG. 8 is a flow chart showing a procedure of a method of regenerating a semiconductor wafer according to a third preferred embodiment of the present invention. As shown therein, the steps S1 and S2 are performed in the same manner as in the first preferred embodiment.

After the step S2, the used silicon wafer is immersed in an alkaline solution containing one of potassium hydroxide (KOH) and sodium hydroxide (NaOH) in a step S11. This allows for reduction of foreign substances such as metallic impurities contained in the used silicon wafer.

Next, the step S3 follows, in which the same surface treatment as performed in the step S3 shown in FIG. 1 and described in the first preferred embodiment is performed.

After the step S3, the high temperature annealing process of the step S4 is performed, to ultimately obtain a regenerate wafer. However, the high temperature annealing process of the step S4 can be replaced with the expitaxial growth process of the step S5 as indicated by terms in parentheses in FIG. 8.

The high temperature annealing process of the step S4 in the present embodiment is performed in the same manner as in the high temperature annealing process employing an argon atmosphere in the step S4 shown in FIG. 1 and described in the first preferred embodiment. Also, the epitaxial growth process of the step S5 in the present embodiment is performed in the same manner as the epitaxial growth process of the step S5 shown in FIG. 5 and described in the second preferred embodiment.

The method of regenerating a semiconductor wafer according to the third preferred embodiment produces the same advantages as produced by the first or second preferred embodiment. In addition, the immersing process using an alkaline solution of the step S11 produces a further advantage of reducing foreign substances, which allows for further improvement in the quality of the regenerate wafer.

<Modifications>

The first preferred embodiment and the second preferred embodiment can be combined with each other. Specifically, the epitaxial growth process of the step S5 in the second preferred embodiment (see FIGS. 5 and 6) can be performed after the high temperature annealing process of the step S4 in the first preferred embodiment (see FIGS. 1 and 2). This allows for further improvement in the quality of the regenerate wafer.

Alternatively, to perform the step S4 subsequently to the step S5 in the third preferred embodiment would also allow for further improvement in the quality of the regenerate wafer.

While the invention has been shown and described in detail, the foregoing description is in all aspects illustrative and not restrictive. It is therefore understood that numerous modifications and variations can be devised without departing from the scope of the invention.

What is claimed is:

1. A method of regenerating a semiconductor wafer from a used semiconductor wafer in which a surface coating layer including a metal film and an insulating film is formed at least in a surface thereof, said method comprising the steps of:
    (a) polishing said surface of said used semiconductor wafer;
    (b) immersing said used semiconductor wafer after said step (a) in mixed acids comprising at least two kinds of acids;
    (c) performing a surface treatment on said used semiconductor wafer after said step (b) to provide a quasi-regenerate wafer; and
    (d) performing an annealing process on the quasi-regenerate wafer at a temperature of 1200° C. or higher.

2. A method of regenerating a semiconductor wafer from a used semiconductor wafer in which a surface coating layer including a metal film and an insulating film is formed at least in a surface thereof, said method comprising the steps of:
    (a) polishing said surface of said used semiconductor wafer;
    (b) immersing said used semiconductor wafer after said step (a) in mixed acids comprising at least two kinds of acids;
    (c) performing a surface treatment on said used semiconductor wafer after said step (b) to provide a quasi-regenerate wafer; and
    (d) performing an annealing process on the quasi-regenerate wafer in an atmosphere of inert gas.

3. The method of regenerating a semiconductor wafer according to claim 1, further comprising the step of
    (e) immersing said used semiconductor waferin an alkaline solution containing one of potassium hydroxide and sodium hydroxide, between said steps (b) and (c).

4. The method of regenerating a semiconductor wafer according to claim 1, further comprising the step of
    (f) causing said quasi-regenerate wafer after said step (d) to epitaxially grow to form an epitaxial growth layer, thereby obtaining a regenerate wafer including said quasi-regenerate wafer and said epitaxial growth layer.

5. A method of regenerating a semiconductor wafer from a used semiconductor wafer in which a surface coating layer including a metal film and an insulating film is formed at least in a surface thereof, said method comprising the steps of:
    (a) polishing said surface of said used semiconductor wafer;
    (b) immersing said used semiconductor wafer after said step (a) in mixed acids including at least two kinds of acids;
    (c) performing a surface treatment on said used semiconductor wafer after said step (b) to provide a quasi-regenerate wafer; and
    (d) causing said quasi-regenerate wafer to epitaxially grow to form an epitaxial growth layer, thereby obtaining a regenerate wafer including said quasi-regenerate wafer and said epitaxial growth layer.

6. The method of regenerating a semiconductor wafer according to claim 5, further comprising the step of
    (e) immersing said used semiconductor wafer in an alkaline solution one of potassium hydroxide and sodium hydroxide, between said steps (b) and (c).

7. The method of regenerating a semiconductor wafer according to claim 1, wherein
    said used semiconductor wafer includes a dummy semiconductor wafer which is used for a test and does not have an integrated circuit formed in a surface thereof.

8. The method of regenerating a semiconductor wafer according to claim 5, wherein
    said used semiconductor wafer includes a dummy semiconductor wafer which is used for a test and does not have an integrated circuit formed in a surface thereof.

9. The method of regenerating a semiconductor wafer according to claim 2, wherein the inert gas comprises hydrogen.

10. The method of regenerating a semiconductor wafer according to claim 9, wherein the step of annealing is performed at a temperature of 1200° C. or higher.

11. The method of regenerating a semiconductor wafer according to claim 2, wherein the inert gas comprises argon.

12. The method of regenerating a semiconductor wafer according to claim 11, wherein the step of annealing is performed at a temperature of 1200° C. or higher.

13. The method of regenerating a semiconductor wafer according to claim 2, wherein the step of annealing is performed at a temperature of 1200° C. or higher.

14. The method of regenerating a semiconductor wafer according to claim 2, wherein said used semiconductor wafer includes a dummy semiconductor wafer which is used for a test and does not have an integrated circuit formed in a surface thereof.

* * * * *